United States Patent
Han et al.

(10) Patent No.: US 6,970,383 B1
(45) Date of Patent: Nov. 29, 2005

(54) METHODS OF REDUNDANCY IN A FLOATING TRAP MEMORY ELEMENT BASED FIELD PROGRAMMABLE GATE ARRAY

(75) Inventors: Kyung Joon Han, Palo Alto, CA (US); John McCollum, Saratoga, CA (US); Sung-Rea Kim, San Jose, CA (US); Robert Broze, Santa Cruz, CA (US)

(73) Assignee: Actel Corporation, Mountain View, CA (US)

( * ) Notice: Subject to any disclaimer, the term of this patent is extended or adjusted under 35 U.S.C. 154(b) by 145 days.

(21) Appl. No.: 10/459,412

(22) Filed: Jun. 10, 2003

(51) Int. Cl.⁷ .............................................. G11C 11/34
(52) U.S. Cl. .................... 365/185.28; 365/200
(58) Field of Search .......................... 365/200, 185.28; 257/37

(56) References Cited

U.S. PATENT DOCUMENTS

| | | | |
|---|---|---|---|
| 4,757,359 A * | 7/1988 | Chiao et al. ................... 257/37 |
| 5,764,096 A | 6/1998 | Lipp et al. ................... 327/434 |
| 5,768,192 A | 6/1998 | Eitan ...................... 365/185.24 |
| 5,838,040 A | 11/1998 | Salter, III et al. ........... 257/321 |
| 6,252,273 B1 | 6/2001 | Salter, III et al. ........... 257/316 |
| 6,356,478 B1 | 3/2002 | McCollum ............. 365/185.01 |
| 6,816,420 B1 * | 11/2004 | Liu et al. .................... 365/200 |

* cited by examiner

*Primary Examiner*—Michael Tran
(74) *Attorney, Agent, or Firm*—Sierra Patent Group, Ltd.

(57) ABSTRACT

A method for providing redundancy in a floating charge trap device based programmable logic device includes the steps of sensing for a predetermined amount of stored charge in a first area of a floating trap devices in a floating trap device pair, and sensing for the predetermined amount of stored charge in a second area of the floating trap devices in the floating trap device pair when the charge in the stored charge in the first area in one of the floating trap devices is below the predetermined amount.

49 Claims, 6 Drawing Sheets

METHODS OF REDUNDANCY IN A FLOATING TRAP MEMORY ELEMENT BASED FIELD PROGRAMMABLE GATE ARRAY

BACKGROUND OF THE INVENTION

1. Field of the Invention

The present invention relates to providing redundancy for programmable memory elements in a field programmable gate array (FPGA). More particularly, the present invention relates to providing redundancy for floating trap configuration memory elements in an FPGA.

2. The Background Art

Programmable logic devices (PLDs) are integrated circuit devices which contain gates or other general-purpose cells whose interconnections can be configured by programming to implement nearly any desired combinatorial or sequential function. Field programmable gate arrays (FPGAs) are well known in the PLD art. FPGAs generally include an array of general-purpose logic circuits, typically referred to as logic blocks, which can be programmed by programmable elements to implement virtually any logic function. The programmed logic elements in the gate array are connected together by routing resources to form a desired integrated circuit. The routing resources are connected to each other and to the logic elements in the gate array by programmable elements.

It is well known in the art that both volatile and non-volatile programmable elements have been used in FPGA devices. Volatile programmable elements are often a pass transistor controlled by a static random access memory (SRAM) cell. In an SRAM based reprogrammable FPGA, the programmable elements are typically passgates controlled by information stored in an SRAM configuration memory. Nonvolatile programmable elements include antifuses and floating gate transistors. In an antifuse based FPGA, the antifuses are programmable elements that represent an open state until programmed. The antifuses are disposed to provide the interconnections among the routing resources and to program the programmable logic elements.

In a floating gate transistor based FPGA, the floating gate element typically is the switching element employed to provide the interconnections among the routing resources and the programmable logic elements. Some examples of floating gate based FPGA devices are disclosed in U.S. Pat. Nos. 6,356,478; 5,764,096; 6,252,273; and 5,838,040. These devices employ floating gates similar to those used in flash memories, but adapted for use in programmable arrays. In addition to being non-volatile, configuration in a floating gate based device does not require as much integrated circuit area as configuration in an SRAM based device. Programmable antifuse based architectures and reprogrammable SRAM and floating gate memory cell based architectures are well known in the FPGA art.

Generally, in a floating gate memory cell, an MOS based transistor has an additional unconnected or floating polysilicon layer disposed in a dielectric between a semiconductor surface and the gate of the MOS transistor. To program the floating gate memory cell, electrons are placed on the floating polysilicon layer, and to erase the floating gate memory cell, electrons are removed from the floating polysilicon layer. As is well known in the art, a floating gate memory cell is programmed when sufficient electrons are placed on the floating polysilicon layer to prevent the MOS transistor of the floating gate memory cell from being turned on. The charged floating polysilicon layer opposes a voltage which, when applied to the gate of the floating gate memory cell would typically turn-on the MOS transistor of the floating gate memory cell. When these electrons are removed, a normal operating voltage applied to the gate of floating gate transistor will result in current flowing through the MOS transistor of the floating gate memory cell. This current may then be sensed to determine whether a particular floating gate memory cell has been programmed.

There are a variety of known floating gate memory cell technologies. These differences in the art are due at least in some instances to the specific geometry of the floating gate, the distance from the semiconductor surface of the floating gate in the dielectric, the inclusion of additional gates in the MOS transistor of the floating gate memory cell, the manner in which electrons are placed on and removed from the floating gate, and the diverse arrangements of the floating gate memory cells into memory cell arrays. These various technologies, well known to those of ordinary skill in the art include at least, electrically programmable read only memory (EPROM), electrically erasable and programmable read only memory (EEPROM), flash EEPROM, NOR flash and NAND flash.

An EPROM memory cell can be programmed by channel hot electron injection. For channel hot electron injection, well known to those of ordinary skill in the art, in a substrate ground mode with the substrate held at 0 volts, the gate of the MOS transistor in the floating gate memory cell is held at about 9 to about 12 volts, the source of the MOS transistor in the floating gate memory cell is held at 0 volts, and the drain of the MOS transistor in the floating gate memory cell is held at about 4 to about 5 volts. In a substrate enhanced mode with the substrate held at −2 to about −4 volts, the gate of the MOS transistor in the floating gate memory cell is held at about 6 to about 8 volts, the source of the MOS transistor in the floating gate memory cell is held at 0 volts, and the drain of the MOS transistor in the floating gate memory cell is held at about 3 to about 4 volts. The electric field generated by the voltage between the gate and the source provides enough energy to some of the electrons traveling from source to the drain to collect on the floating gate. The programming time for channel hot electron injection is about 1 ms to about 5 ms. An EPROM memory cell is erased by UV light.

An EEPROM memory cell is either programmed by channel hot electron injection or Fowler-Nordheim tunneling. With Fowler-Nordheim tunneling, well known to those of ordinary skill in the art, in a substrate ground mode with the substrate held at 0 volts, the gate of the MOS transistor in the floating gate memory cell is held at about 12 to about 15 volts, and the source and the drain of the MOS transistor in the floating gate memory cell is held at 0 volts. In a substrate enhanced mode with the substrate held at about 6 to about 8 volts, the gate of the MOS transistor in the floating gate memory cell is held at about −6 to about −8 volts, and the source and the drain of the MOS transistor in the floating gate memory cell is held at 0 volts. This results in electrons tunneling onto the floating gate.

In Fowler-Nordheim tunneling erase of an EEPROM memory cell, well known to those of ordinary skill in the art, in a substrate ground mode with the substrate held at 0 volts, the gate of the MOS transistor in the floating gate memory cell is held at about −12 to about −15 volts, and the source and the drain of the MOS transistor in the floating gate memory cell is held at 0 volts. In a substrate enhanced mode with the substrate held at about −6 to about −8 volts, the gate of the MOS transistor in the floating gate memory cell is held at about 6 to about 8 volts, and the source and the drain of the MOS transistor in the floating gate memory cell are held at 0 volts. This results in electrons tunneling off of the floating gate. The programming and erase times for Fowler-Nordheim tunneling are about 2 ms to about 20 ms.

A flash EEPROM memory array is quite similar to an EEPROM memory array, with the notable difference that a flash EEPROM can be erased on a block level basis. The erase becomes a part of the program routine, and the data to be programmed is typically stored in an on-chip buffer.

A NOR flash memory array is typically programmed by channel hot electron injection, and erased by Fowler-Nordheim tunneling. A NAND flash is programmed and erased by Fowler-Nordheim tunneling. In the programming and erase of a NAND flash the bias is applied between the gate and the substrate of the MOS transistor in the floating gate memory cell and is typically greater than 20 volts. "NOR" and "NAND" flash are referred to as such based upon the manner in which the memory cells in the flash memory cell arrays are connected to each other.

Floating gate memory cells have some performance characteristics such as long programming and erase times, high programming voltages, insufficient data retention times, limited number of programming cycles, and large integrated circuit area requirements which have led to the investigation and development of other programmable non-volatile memory (NVM) technologies.

One of these technologies is a floating trap MOS transistor. In a floating trap MOS transistor, charge is stored (trapped) in or removed from after being trapped in, a dielectric separating a gate of a MOS transistor from the semiconductor substrate. Unlike a floating gate transistor, where charge stored on the polysilicon conductor may flow freely in the polysilicon conductor, charge stored in a floating trap MOS transistor remains in the region of the floating trap material above the source or drain where it was originally placed during programming. Accordingly, a bit of information may be stored above each of the junctions of a floating trap MOS transistor for a total of two bits.

Two well known, and similar floating trap transistor technologies include silicon-oxide-nitride-oxide-silicon (SONOS) and metal-oxide-nitride-oxide-silicon (MONOS). In each of these devices, the dielectric separating the gate of the MOS transistor from the semiconductor substrate is an oxide-nitride-oxide (ONO) layer. The programming of MONOS/SONOS devices has been by both channel hot electron injection and Fowler-Nordheim tunneling as described above. After programming, the charge is trapped in the nitride layer in the region of the floating trap material above the source or drain of the MOS transistor of the MONOS/SONOS device. In more recent advances in the floating trap transistor technology of MONOS/SONOS devices, a thicker bottom oxide layer in the ONO dielectric has been employed to improve charge retention and to reduce read disturb.

Erase of MONOS/SONOS devices has been by both Fowler-Nordheim tunneling, as described above, and tunneling enhanced hot hole injection. In erase by tunneling enhanced hot hole injection, well known to those of ordinary skill in the art, the charge stored in either one or both of the regions of the floating trap material above the source or drain of the MOS transistor of the MONOS/SONOS device may be erased by injecting holes into the desired charge trapping region of the nitride layer. In a one sided substrate ground mode with the substrate held at 0 volts, the area above the drain junction can be erased by applying about −6 to about −8 volts to the gate of the MOS transistor in the floating gate memory cell, letting the source of the MOS transistor in the floating gate memory cell float, and applying about 4 to about 7 volts to the drain of the MOS transistor in the floating gate memory cell. In a two-sided substrate ground mode, both the source and the drain are held at about 5 to about 6 volts.

In a one sided substrate enhanced mode with the substrate held at −2 to about −3 volts, the area above the drain junction can be erased by applying about −4 to about −6 volts to the gate of the MOS transistor in the floating gate memory cell, letting the source of the MOS transistor in the floating gate memory cell float, and applying about 3 to about 4 volts to the drain of the MOS transistor in the floating gate memory cell. In a two-sided substrate enhanced mode, both the source and the drain are held at about 3 to about 4 volts.

To read the charge trapped above a first junction in a MONOS/SONOS device with the substrate at ground, a first potential about 1 to about 2 volts is applied to a first source/drain region associated with the first junction, a second potential at ground is applied to a second source/drain associated with a second junction in the MOS transistor of the MONOS/SONOS device, and a third potential of about 3 to about 4 volts is applied to the gate of the MONOS/SONOS device. During the read, a sense of the current through the MONOS/SONOS device is performed to determine the programmed state of the floating trap device. It should be appreciated that the ratio of the potential differences between the first potential and the second potential and the third potential and the second potential is about 1.5 to about 4.

In U.S. Pat. No. 5,768,192 a charge trapping device is described that is programmed using channel hot electron injection, and erased with tunneling enhanced hot hole injection. To read the charge trapped above a first junction in a MONOS/SONOS device with the substrate at ground, a first potential at ground is applied to the first source/drain region associated with a the first junction, a second potential at about 1 to about 2 volts is applied to a second source/drain associated with a second junction in the MOS transistor of the MONOS/SONOS device, and a third potential at about 3 to about 4 volts is applied to the gate of the MONOS/SONOS device. It should be appreciated that the ratio of the potential differences between the second potential and the first potential and the third potential and the first potential is about 1.5 to about 4.

In a PLD, when during manufacturing a defect occurs in either the logic or programmable elements, it is desirable to have redundancy in the PLD to avoid the defect, and thereby keep the entire device from being defective. A proposed scheme for providing redundancy in a PLD when either the logic elements or the programmable elements for connecting the logic elements together have a defect is described in U.S. Pat. No. 5,498,975 to Cliff et al. In this scheme, spare columns or rows of logic blocks and programmable elements (switches) are provided in the PLD array to replace the defective logic elements or programmable elements in the PLD. These additional columns or rows are provided at the expense of reducing the available logic resources in the PLD. Accordingly, it would advantageous to provide redundancy in a PLD without including spare rows or columns in the PLD.

BRIEF DESCRIPTION OF THE INVENTION

In a first embodiment, according to the present invention, a method for providing redundancy in a floating charge trap device based programmable logic device includes the steps of sensing for a predetermined amount of stored charge in a first area in each of the floating trap devices in a floating trap device pair, and sensing for the predetermined amount of stored charge in a second area in each of the floating trap devices in the floating trap device pair when the charge in the stored charge in the first area in one of the floating trap devices is below the predetermined amount.

In a second embodiment, according to the present invention, a method for providing redundancy in a programmable logic device having floating charge trap devices programmed by channel hot electron injection includes the steps of sensing for a predetermined amount of stored charge in a first area of the floating trap devices, and storing charge by Fowler-Nordheim tunneling in each of the floating trap devices having stored charge in the first area less than the predetermined amount.

In a third embodiment, according to the present invention, a method for providing redundancy in a programmable logic device having floating charge trap devices erased by hot hole injection includes the steps of sensing for a predetermined amount of stored charge in a first area of the floating trap devices, and erasing charge by Fowler-Nordheim tunneling in each of the floating trap devices having stored charge in the first area greater than the predetermined amount.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
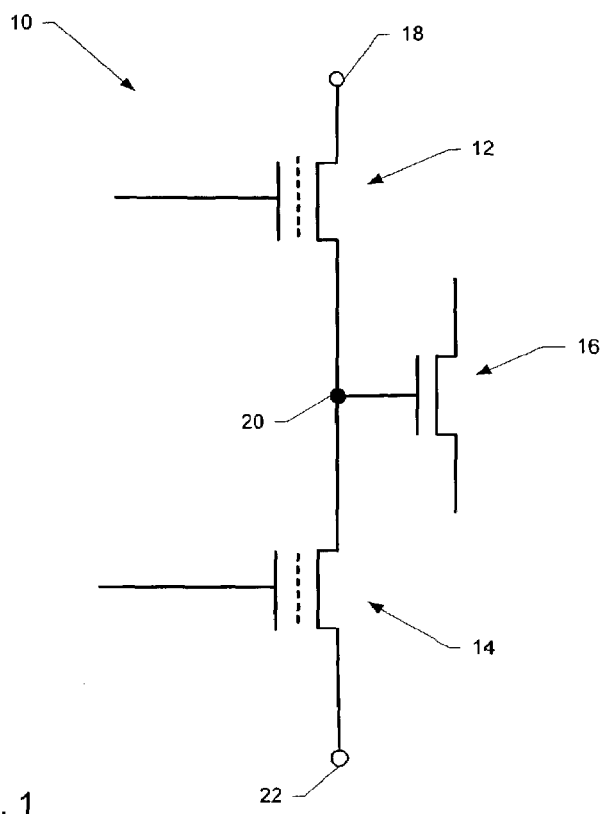
FIG. 1 illustrates schematically a three transistor (3T) cell according to the present invention.

In FIG. 1, a three transistor (3T) cell 10 according to the present invention is illustrated schematically. In 3T cell 10, first and second n-channel MOS charge trapping transistors 12 and 14 control the operation of n-channel MOS switch transistor 16. It should be appreciated that n-channel MOS switch transistor 16 can be employed for any programmable function encountered in an FPGA circuit.

First n-channel MOS charge trapping transistor 12 has its drain electrically coupled to a first voltage potential node 18, preferably the device supply voltage (Vcc), and its source electrically coupled to an output node 20 to which the gate of n-channel MOS switch transistor 16 is electrically coupled. Second n-channel MOS charge trapping transistor 14 has its drain electrically coupled to output node 20, and its source electrically coupled to a second voltage potential node 22, preferably ground.

Figure 2:
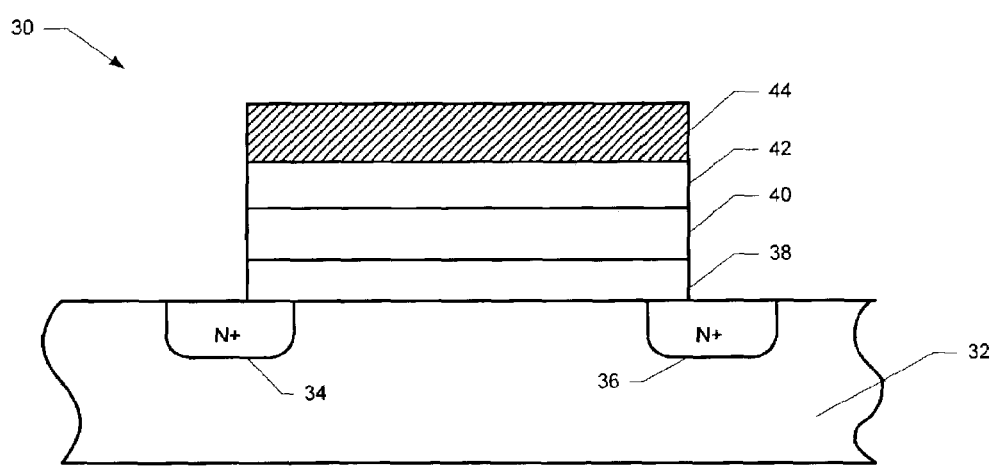
FIG. 2 illustrates a floating trap device in cross section suitable for use according to the present invention.

In FIG. 2, an n-channel MOS charge trapping transistor 30 suitable for use according to the present invention is illustrated schematically in cross section. In n-channel MOS charge trapping transistor 30, a p-type semiconductor substrate 32 has an n-type source region 34 and an n-channel drain region 36. A lower silicon dioxide layer 38 of about 20 to about 60 angstroms in thickness is disposed above the substrate 32 and a portion of the source and drain regions 34 and 36, respectively. A silicon nitride layer 40 of about 60 to about 80 angstroms in thickness is disposed above the silicon dioxide layer 38. The silicon nitride layer 40 forms the floating trap layer which traps electrons as they are injected across the oxide layer 38 and into the nitride layer 40. An upper layer of silicon dioxide 42 of about 60 angstroms is formed over the nitride layer 40. A polysilicon conductive control gate 44 is disposed above the upper oxide layer 42. The upper oxide layer 42 functions to electrically isolate the conductive gate 44 from floating trap 40.

Figure 3A:
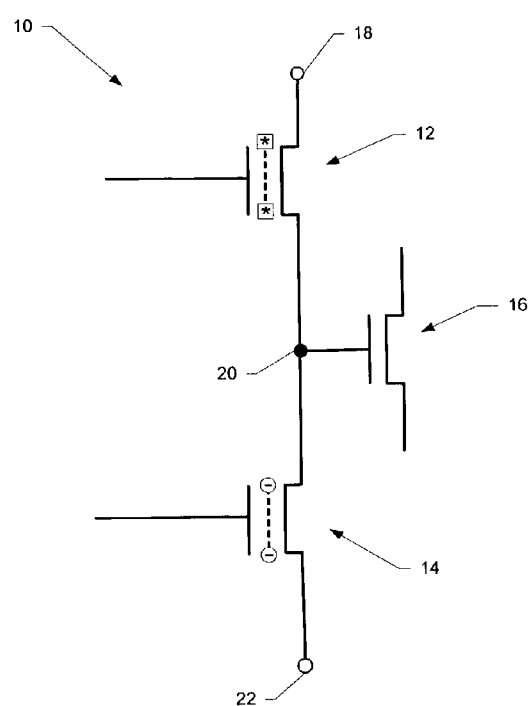
FIG. 3A illustrates a 3T memory cell as programmed to turn-on an n-channel MOS switch transistor according to the present invention.
Figure 3B:
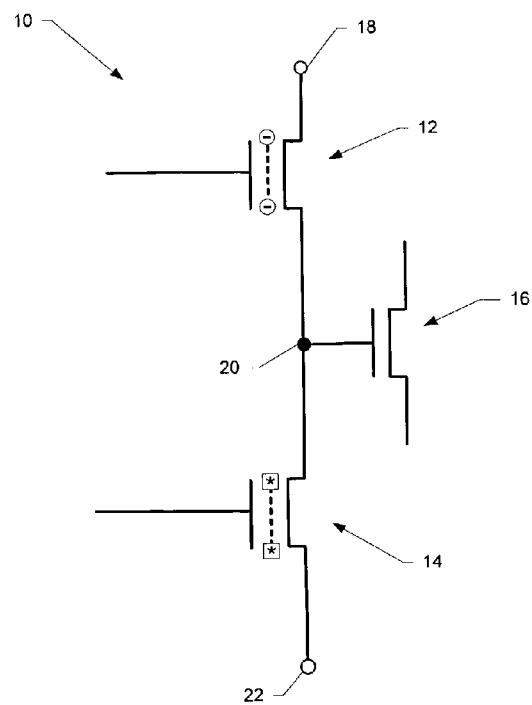
FIG. 3B illustrates a 3T memory cell as programmed to turn-off an n-channel MOS switch transistor according to the present invention.

In FIGS. 3A and 3B, the 3T memory cell 10 is illustrated as being programmed to turn-on and turn-off n-channel MOS switch transistor 16, respectively. To avoid overcomplicating the disclosure and thereby obscuring the present invention, a detailed description of the programming of 3T memory cell 10 is not made herein. Such a description is disclosed in U.S. patent application Ser. No. 11/152,018, filed Jun. 13, 2005 by inventors Kyung Joon Han, Sung-Rae Kim and Robert Broze, entitled "Non-volatile Programmable Logic Cell for a Field Programmable Gate Array", assigned to the same assignee as the present invention, and hereby incorporated by reference.

In FIG. 3A, n-channel MOS charge trapping transistor 12 is programmed to be on and n-channel MOS charge trapping transistor 14 is programmed to be off. This places Vcc at node 20 to turn-on n-channel MOS switch transistor 16. In FIG. 3B, n-channel MOS charge trapping transistor 12 is programmed to be off, and n-channel MOS charge trapping transistor 14 is programmed to be on. This places ground at node 20 to turn-off n-channel MOS switch transistor 16. In both FIGS. 3A and 3B, the absence of trapped electrons in the charge trapping layer above the source and drain junctions is indicated by an asterisk (*), whereas the negative (−) signs in the charge trapping layer above the source and drain junctions indicate the presence of trapped electrons.

Figure 4:
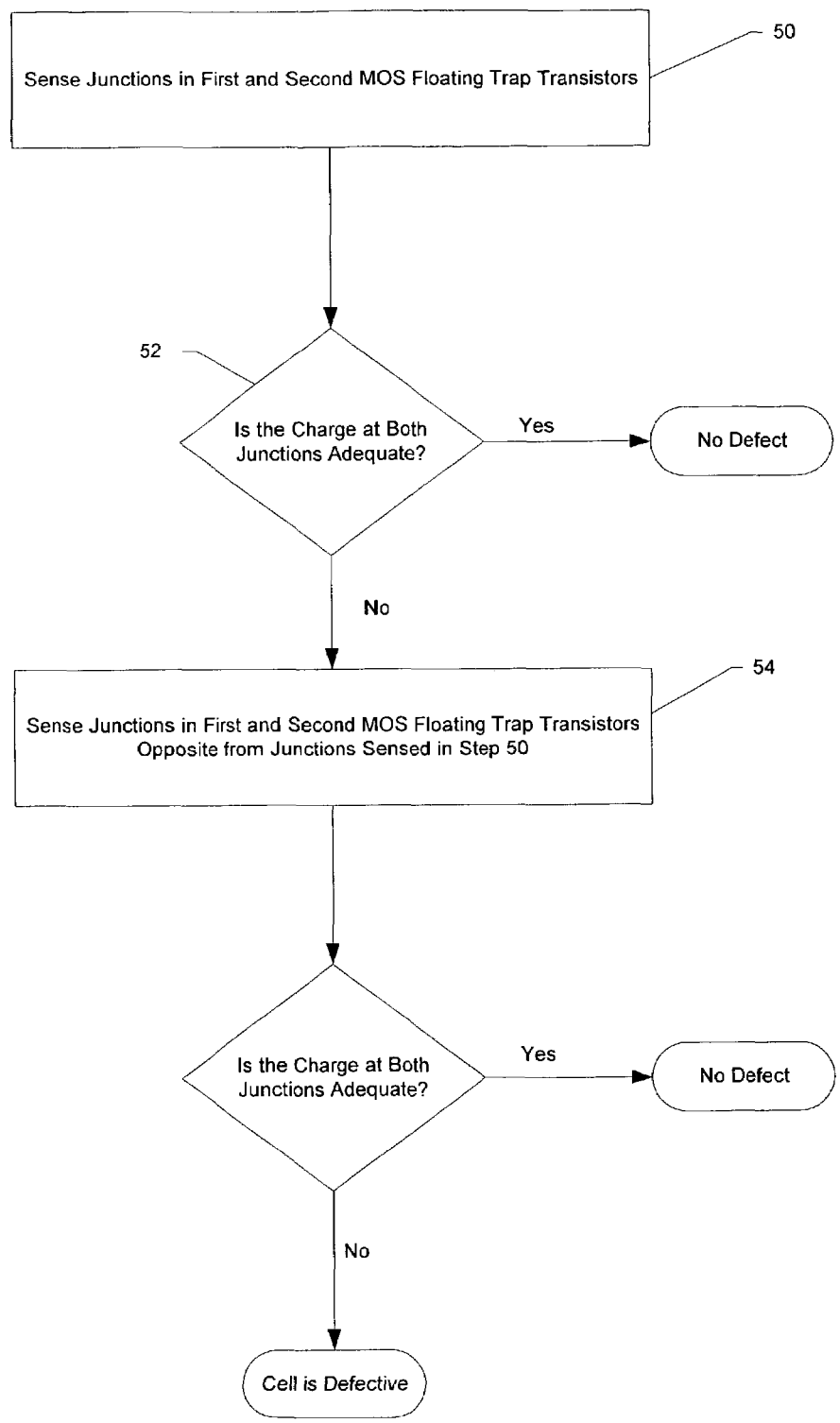
FIG. 4 is flow diagram of a first embodiment of a redundancy scheme according to the present invention.

FIG. 4 is a flow diagram illustrating the steps of a first embodiment of a redundancy scheme according to the present invention. In step 50 the charge in the trapping layer in a first area above either the source or the drain of n-channel MOS charge trapping transistor 12 is read (sensed) along with the charge above the opposite junction of n-channel MOS charge trapping transistor 14. For example, if the charge above the drain junction of n-channel MOS charge trapping transistor 12 is read, then the charge above the source junction of n-channel MOS charge trapping transistor 14 will also be read. Otherwise, if the charge above the source junction of n-channel MOS charge trapping transistor 12 is read, then the charge above the drain junction of n-channel MOS charge trapping transistor 14 will also be read.

Figure 5:
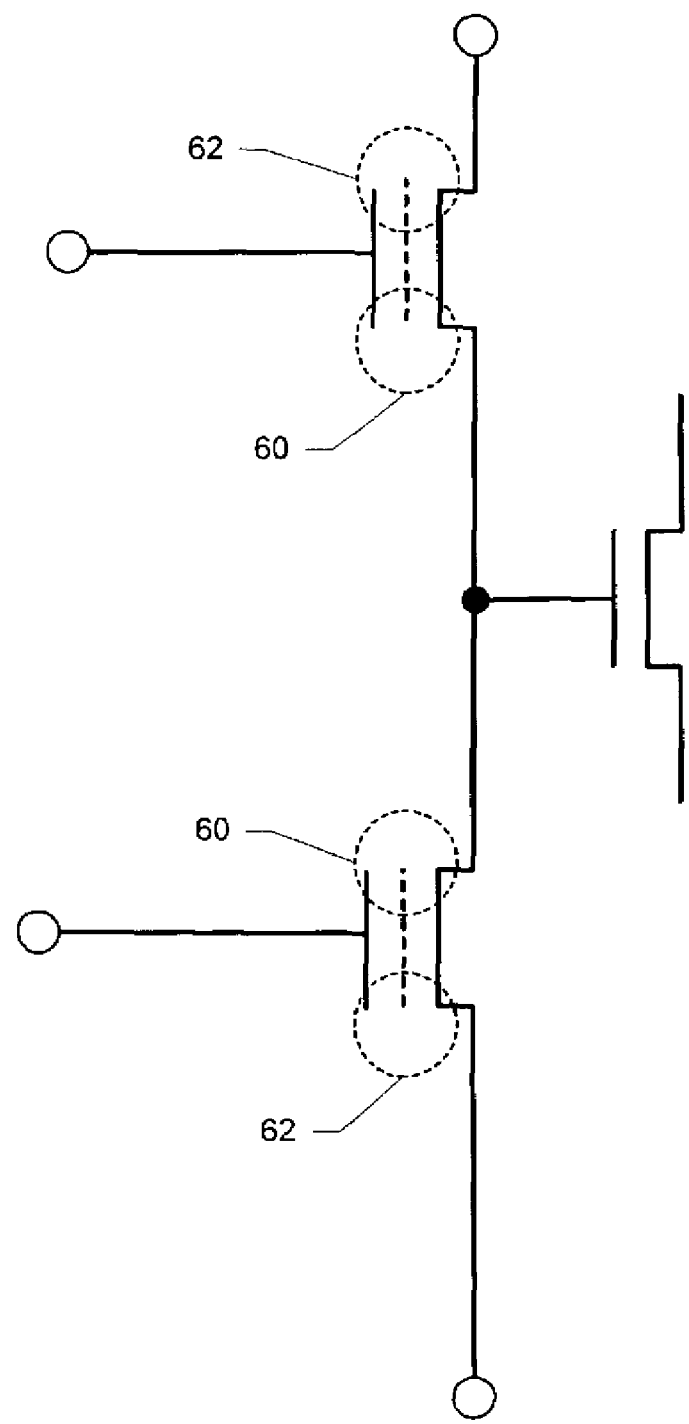
FIG. 5 illustrates opposite junctions in n-channel transistors in a 3T memory cell according to the present invention.

Preferably, in this manner, the charge on both n-channel MOS charge trapping transistors 12 and 14 may be read simultaneously. In FIG. 5, the areas above the opposite junctions which may be read simultaneously according to the present invention are depicted as enclosed by 62 and 60. It should be appreciated that the charge in the trapping layer in a first area above either the source or the drain of n-channel MOS charge trapping transistor 12 and the charge above the similar junction of n-channel MOS charge trapping transistor 14 may be read sequentially rather than simultaneously.

To sense the charge trapped above the junctions of the n-channel MOS charge trapping transistors 12 and 14 in step 50, potentials may applied to the source, drain and gate of each of the n-channel MOS charge trapping transistors 12 and 14 in a manner described previously, and well known to those of ordinary skill in the art. Sensing the current flowing through the n-channel MOS charge trapping transistors 12 and 14 by, for example, a sense amplifier is well known to those of ordinary skill in the art will not be described herein to avoid overcomplicating the disclosure, and thereby obscuring the present invention.

In step 52 it is determined whether the n-channel MOS charge trapping transistors 12 and 14 are adequately programmed based on the reading in step 50. If the charge above one of the junctions of transistor 12 or 14 is not adequate, charge in a second area above the opposite junction of the n-channel MOS charge trapping transistor 12 or 14 that was not read in step 50, is read in step 54.

In this manner, in step 54, when the charge in a first area above a junction read in step 50 is considered inadequate in step 52, the memory cell 10 may be still be considered as non-defective or adequately programmed according to the present invention if adequate charge is stored in the second area above the opposite junction in the same n-channel MOS charge trapping transistor 12 or 14 considered inadequately programmed in step 52. This is due to the fact that even though each of the n-channel MOS charge trapping transistors 12 and 14 can store two bits of information, both of the bits of stored information, according to the present invention, are the same, so that during the operation of the 3T cell 10 only one of the junctions in each of the n-channel MOS charge trapping transistors 12 and 14 will be sensed. By programming the areas above both of the junctions in the n-channel MOS charge trapping transistors 12 and 14 with the same bits of information, even though only one bit is needed for successful operation of the device, a redundancy scheme is implemented.

Figure 6:
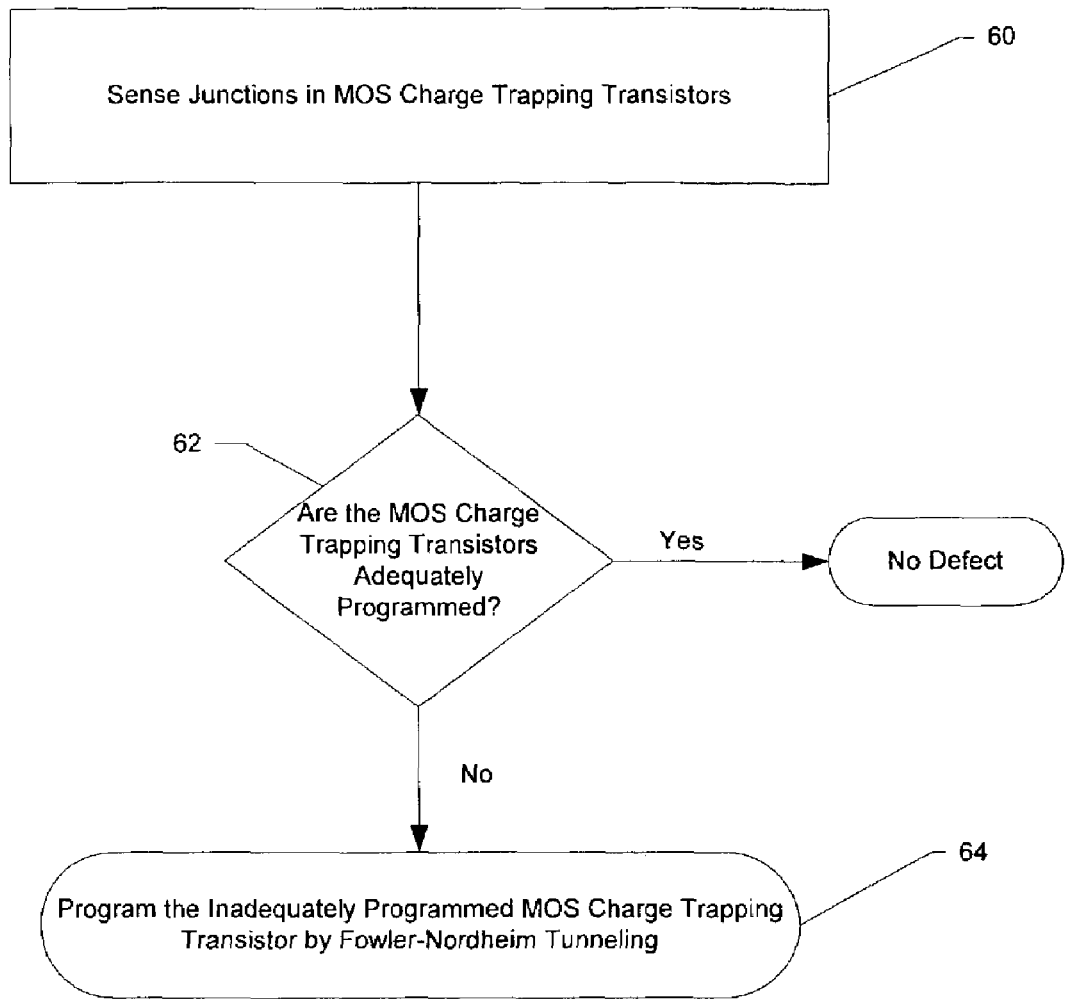
FIG. 6 is flow diagram of a second embodiment of a redundancy scheme according to the present invention.

FIG. 6 is a flow diagram illustrating the steps of a second embodiment of a redundancy scheme according to the present invention. In step 60, the charge above the junctions of the n-channel MOS charge trapping transistors 12 and 14 is read. In step 62, it is determined whether the n-channel MOS charge trapping transistors 12 or 14 have been adequately programmed by channel hot electron injection. In step 64, when the programming of either of the n-channel MOS charge trapping transistors 12 or 14 is inadequate in step 62, the charge trapping layer of the inadequately programmed n-channel MOS charge trapping transistor 12 or 14 is programmed by Fowler-Nordheim tunneling.

As described above, for channel hot electron injection programming of the area above the source/drain junctions of an n-channel MOS charge trapping transistor, the gate of the MOS transistor in the n-channel MOS charge trapping transistor is held at a first potential, typically about 8 to about 12 volts greater than a second potential applied to the substrate or well in which the n-channel MOS charge trapping transistor is formed. A first source/drain of n-channel MOS charge trapping transistor above whose junction the electrons are to be trapped is held at ground, while a second source/drain of the n-channel MOS charge trapping transistor is held at a third potential that is lower than the first potential on the gate and is typically about 4 to about 7 volts greater than the second potential. The programming time for channel hot electron injection is about 1 ms to about 5 ms. It should be appreciated that with hot electron injection the ratio of the potential differences between the first potential and the second potential and the third potential and second potentials has a range of about 3 to about 1.

In comparison, for programming by Fowler-Nordheim tunneling, the gate of the MOS transistor in the n-channel MOS charge trapping transistor is held at a first potential that is typically about 12 to about 16 volts greater than a second potential applied to the substrate or well in which the n-channel MOS charge trapping transistor is formed. Both of the source/drain regions of the n-channel MOS charge trapping transistor are held at ground or allowed to float. The programming time for Fowler-Nordheim tunneling is about 2 ms to 20 ms.

In step 66, the n-channel MOS charge trapping transistors 12 or 14 found in step 62 to be inadequately programmed, and then programmed in step 64 by Fowler-Nordheim tunneling, is sensed to determine whether it has been adequately programmed in step 64. If the n-channel MOS charge trapping transistors 12 or 14 is still inadequately programmed, the die is considered defective.

Figure 7:
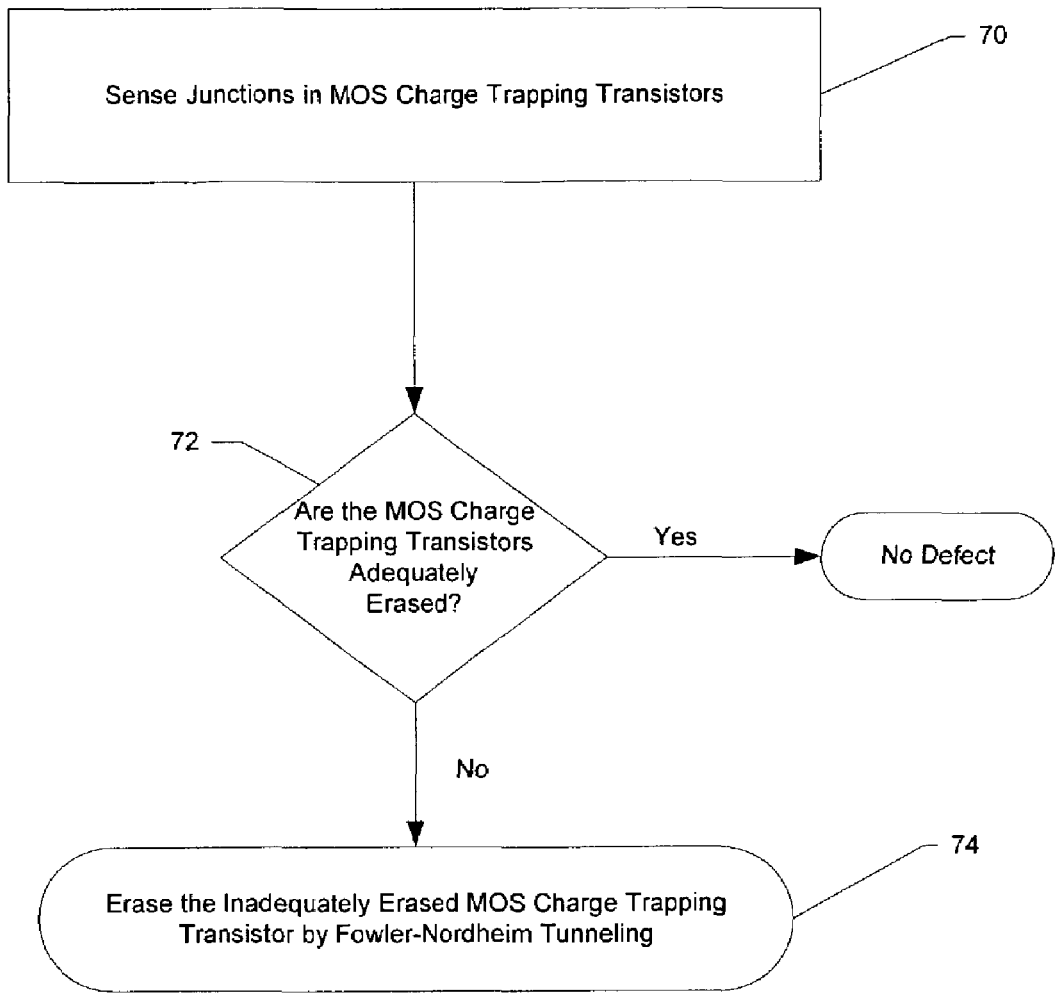
FIG. 7 is flow diagram of a third embodiment of a redundancy scheme according to the present invention.

FIG. 7 is a flow diagram illustrating the steps of a third embodiment of a redundancy scheme according to the present invention. In step 70, the charge above the junctions of the n-channel MOS charge trapping transistors 12 and 14 is read. In step 72, it is determined whether the n-channel MOS charge trapping transistors 12 or 14 have been adequately erased by tunneling enhanced channel hot hole injection. In step 74, when the erasure of either of the n-channel MOS charge trapping transistors 12 or 14 is inadequate in step 72, the charge trapping layer of the inadequately erased n-channel MOS charge trapping transistor 12 or 14 is erased by Fowler-Nordheim tunneling.

As described above, for tunneling enhanced hot hole injection erasure of one of the areas above the source/drain junctions of an n-channel MOS charge trapping transistor, the gate of the MOS transistor in the n-channel MOS charge trapping transistor is held at a first potential, typically about 8 to about 12 volts less than a second potential applied to the substrate or well in which the n-channel MOS charge trapping transistor is formed. A first source/drain of n-channel MOS charge trapping transistor above whose junction the electrons are to be erased is held at a third potential that is higher than the first potential on the gate and is typically about 4 to about 7 volts greater than the second potential, while a second source/drain of the n-channel MOS charge trapping transistor is allowed to float. For tunneling enhanced hot hole injection erasure of both of the areas above the source/drain junctions of an n-channel MOS charge trapping transistor, both the first and second source/drain regions of n-channel MOS charge trapping are held at a third potential that is higher than the first potential on the gate and is typically about 4 to about 7 volts greater than the second potential. The erase time for hot hole injection is about 1 ms to 5 ms. It should be appreciated that with tunneling enhanced hot hole injection the ratio of the potential differences between the first potential and the second potential and the third potential and second potentials has a range of about −3 to about −1.

In comparison, for erasure by Fowler-Nordheim tunneling, the gate of the MOS transistor in the n-channel MOS charge trapping transistor is held at a first potential that is typically about 12 to about 16 volts less than a second potential applied to the substrate or well in which the n-channel MOS charge trapping transistor is formed. Both of the source/drain regions of the n-channel MOS charge trapping transistor are held at ground or allowed to float. The programming time for Fowler-Nordheim tunneling is about 2 ms to about 20 ms.

In step 76, the n-channel MOS charge trapping transistor 12 or 14 found in step 72 to be inadequately erased, and then erased in step 74 by Fowler-Nordheim tunneling, is sensed to determine whether it has been adequately erased in step 74. If the n-channel MOS charge trapping transistor 12 or 14 is still inadequately erased, the die is considered defective.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for providing redundancy in an MOS floating charge trap based programmable logic device comprising:
    sensing for a predetermined amount of stored charge in a first area above a first source/drain region junction in a first MOS floating trap device of a floating trap device pair;
    sensing for said predetermined amount of stored charge in a second area above a second source/drain region junction in said first floating trap device when said stored charge in said first area of said first floating trap device is less than said predetermined amount;
    sensing for a predetermined amount of stored charge in a first area above a first source/drain region junction in a second MOS floating trap device of a floating trap device pair; and
    sensing for said predetermined amount of stored charge in a second area above a second source/drain region junction in said second MOS floating trap device when said stored charge in said first area of said second floating trap device is less than said predetermined amount.

2. A method as in claim 1 wherein said sensing for a predetermined amount of stored charge in said first area of said first MOS floating trap device further comprises:
    applying a first potential to a first source/drain region associated with said first source/drain region junction in said first MOS floating trap device;
    applying a second potential to a second source/drain region associated with said second source/drain region junction in said first floating trap device and to a substrate in which said first MOS floating trap device is disposed, said first potential being about 1 to about 2 volts greater than said second potential; and
    applying a third potential to a gate in said first MOS floating trap device, said third potential is about 3 to about 4 volts greater than said second potential.

3. A method as in claim 1 wherein said sensing for a predetermined amount of stored charge in said first area of said first MOS floating trap device further comprises:
    applying a first potential to a first source/drain region associated with said first source/drain region junction in said first MOS floating trap device;
    applying a second potential to a second source/drain region associated with said second source/drain region junction in said first MOS floating trap device and to a substrate in which said first MOS floating trap device is disposed, said first potential greater than said second potential; and
    applying a third potential to a gate in said first MOS floating trap device, said third potential greater than said second potential, said third potential being in a ratio to said first potential at about 1.5 to about 4.

4. A method as in claim 1 wherein said sensing for a predetermined amount of stored charge in said first area of said first MOS floating trap device further comprises:
    applying a first potential to a first source/drain region associated with said first source/drain region junction in said first MOS floating trap device and to a substrate in which said first MOS floating trap device is disposed;
    applying a second potential to a second source/drain region associated with said second source/drain region junction in said first MOS floating trap device, said second potential being about 1 to about 2 volts greater than said first potential; and
    applying a third potential to a gate in said first floating trap device said third potential being about 3 to about 4 volts greater than said first potential.

5. A method as in claim 1 wherein said sensing for a predetermined amount of stored charge in said first area of said first MOS floating trap device further comprises:
    applying a first potential to a first source/drain region associated with said first source/drain region junction in said first MOS floating trap device and to a substrate in which said first MOS floating trap device is disposed;
    applying a second potential to a second source/drain region associated with said second source/drain region junction in said first MOS floating trap device, said second potential being greater than said first potential; and
    applying a third potential to a gate in said first floating trap device, said a third potential greater than said first potential, said third potential being in a ratio to said second potential at about 1.5 to about 4.

6. A method as in claim 1 wherein said sensing for a predetermined amount of stored charge in said first area of said second MOS floating device further comprises:
    applying a fourth potential to a first source/drain region associated with said first source/drain region junction in said second MOS floating trap device;
    applying a fifth potential to a second source/drain region associated with said second source/drain region junction in said second MOS floating trap device and to a substrate in which said second MOS floating trap device is disposed, said fourth potential being about 1 to about 2 volts greater than said fifth potential; and
    applying a sixth potential to a gate in said second floating trap device, said sixth potential being about 3 to about 4 volts greater than said fifth potential.

7. A method as in claim 1 wherein said sensing for a predetermined amount of stored charge in said first area of said second MOS floating device further comprises:
    applying a fourth potential to a first source/drain region associated with said first source/drain region junction in said second MOS floating trap device;
    applying a fifth potential to a second source/drain region associated with said second source/drain region junction in said second MOS floating trap device and to a substrate in which said second MOS floating trap device is disposed, said fourth potential being greater than said fifth potential; and applying a sixth potential to a gate in said second floating trap device, said sixth potential greater than said fifth potential, said sixth potential being in a ratio to said fourth potential at about 1.5 to about 4.

8. A method as in claim 1 wherein said sensing for a predetermined amount of stored charge in said first area in said second MOS floating trap device further comprises:
applying a fourth potential to a first source/drain region associated with said first source/drain region junction in said second MOS floating trap device and to a substrate in which said second MOS floating trap device is disposed;
applying a fifth potential to a second source/drain region associated with said second source/drain region junction in said second MOS floating trap device, said fifth potential being about 1 to about 2 volts greater than said fourth potential; and
applying a sixth potential to a gate in said second MOS floating trap device, said sixth potential of about 3 to about 4 volts greater than said fourth potential.

9. A method as in claim 1 wherein said sensing for a predetermined amount of stored charge in said first area in said second MOS floating trap device further comprises:
applying a fourth potential to a first source/drain region associated with said first source/drain region junction in said second MOS floating trap device and to a substrate in which said second MOS floating trap device is disposed;
applying a fifth potential to a second source/drain region associated with said second source/drain region junction in said second MOS floating trap device, said fifth potential being greater than said fourth potential; and
applying a sixth potential to a gate in said second MOS floating trap device, said sixth potential greater than said fourth potential, said sixth potential being in a ratio to said fifth potential at about 1.5 to about 4.

10. A method for providing redundancy in a programmable logic device having a first and a second MOS floating charge trap device programmed by channel hot electron injection comprising:
sensing for a predetermined amount of stored charge in a first area above a first source/drain region junction in the first MOS floating trap device;
sensing for said predetermined amount of stored charge in a second area above a second source/drain region junction in the first MOS floating trap device when said stored charge in said first area of said first MOS floating trap device is less than said predetermined amount;
storing said charge by Fowler-Nordheim tunneling in the first MOS floating trap device, when said stored charge in said second area is less than said predetermined amount;
sensing for a predetermined amount of stored charge in a first area above a first source/drain region junction in the second MOS floating trap device;
sensing for said predetermined amount of stored charge in a second area above a second source/drain region junction in the second MOS floating trap device when said stored charge in said first area of said second MOS floating trap device is less than said predetermined amount;
storing said charge by Fowler-Nordheim tunneling in the second MOS floating trap device when said stored charge in said second area is less than said predetermined amount.

11. A method as in claim 10 wherein said Fowler-Nordheim tunneling is applied for a duration of about 2 ms to about 20 ms.

12. A method as in claim 10 wherein said sensing for a predetermined amount of stored charge in said first area in said first MOS floating trap device further comprises:
applying a first potential to a first source/drain region associated with said first source/drain region junction in said first MOS floating trap device;
applying a second potential to a second source/drain region associated with said second source/drain region junction in said first MOS floating trap device and to a substrate in which said first MOS floating trap device is disposed, said first potential being about 1 to about 2 volts greater than said second potential; and
applying a third potential to a gate in said first MOS floating trap device, said third potential being about 3 to about 4 volts greater than said second potential.

13. A method as in claim 10 wherein said sensing for a predetermined amount of stored charge in said first area of said first MOS floating trap device further comprises:
applying a first potential to a first source/drain region associated with said first source/drain region junction in said first MOS floating trap device and to a substrate in which said first MOS floating trap device is disposed;
applying a second potential to a second source/drain region associated with said second source/drain region junction in said first MOS floating trap device, said second potential being about 1 to about 2 volts greater than said first potential; and
applying a third potential to a gate in said first MOS floating trap device, said third potential being about 3 to about 4 volts greater than said first potential.

14. A method as in claim 10 wherein storing charge in the first MOS floating trap device by Fowler-Nordheim tunneling further comprises:
applying a first potential to the gate of the first MOS charge trapping transistor; and
applying a second potential to the substrate in which the first MOS charge trapping transistor is formed, said first potential being about 12 to about 16 volts greater than said second potential.

15. A method as in claim 14 wherein said first potential and said second potential are applied for a duration of about 2 ms to about 20 ms.

16. A method for providing redundancy in a programmable logic device having an MOS floating charge trap device programmed by channel hot electron injection comprising:
sensing for a predetermined amount of stored charge in a first area above a first source/drain region junction in the MOS floating trap device;
applying a first potential to a gate of the MOS charge trapping transistor; and
applying a second potential to a substrate in which the MOS charge trapping transistor is formed, said first potential being about 12 to about 16 volts greater than said second potential.

17. A method as in claim 16 wherein said first potential and said second potentials are applied for a duration of about 2 ms to about 20 ms.

18. A method as in claim 16 wherein said sensing for a predetermined amount of stored charge in said first area in said MOS floating trap device further comprises:
applying a third potential to a first source/drain region associated with said first source/drain region junction in said MOS floating trap device;

applying a fourth potential to a second source/drain region associated with a second source/drain region junction in said floating trap device and to a substrate in which said MOS floating trap device is disposed, said third potential being about 1 to about 2 volts greater than said fourth potential; and applying a fifth potential to a gate in said MOS floating trap device, said fifth potential being about 2 to about 4 volts greater than said fourth potential.

19. A method as in claim 16 wherein said sensing for a predetermined amount of stored charge in said first area of said MOS floating trap device further comprises:

applying a third potential to said first source/drain region associated with said first source/drain region junction in said MOS floating trap device and to a substrate in which said MOS floating trap device is disposed;

applying a fourth potential to a second source/drain region associated with a second source/drain region junction in said MOS floating trap device, said fourth potential being about 1 to about 2 volts greater than said third potential; and applying a fifth potential to a gate in said MOS floating trap device, said fifth potential being about 2 to about 4 volts greater than said third potential.

20. A method for providing redundancy in a programmable logic device having an MOS floating charge trap device comprising:

applying a first potential to a gate for a first duration;

applying a second potential for said first duration to a substrate in which a MOS charge trapping transistor is disposed, said first potential being greater than said second potential;

applying a ground potential for a first duration to a first source/drain of said MOS charge trapping transistor;

applying a third potential for a first duration to a second source/drain region of said MOS charge trapping transistor, said third potential being greater than said second potential, said first potential being in a ratio to said third potential of about 1 to about 3;

sensing for a predetermined amount of stored charge in a first area above said first source/drain region junction in said MOS floating trap device;

applying a fourth potential for a second duration after said first duration to said gate of said MOS floating trap device; and applying a fifth potential for said second duration to said substrate in which said MOS charge trapping transistor is formed, said fourth potential being about 12 to about 16 volts greater than said fifth potential.

21. A method as in claim 20 wherein said sensing for a predetermined amount of stored charge in said first area in said MOS floating trap device further comprises:

applying a sixth potential to said first source/drain region in said MOS floating trap device;

applying seventh potential to said second source/drain region in said MOS floating trap device and to said substrate in which said MOS floating trap device is disposed, said sixth potential being greater than said seventh potential; and applying an eighth potential to said gate in said MOS floating trap device, said eighth potential greater than said seventh potential, said eighth potential being in a ratio to said sixth potential at about 1.5 to about 4.

22. A method as in claim 20 wherein said sensing for a predetermined amount of stored charge in said first area of said MOS floating trap device further comprises:

applying a sixth potential to said first source/drain region in said MOS floating trap device;

applying seventh potential to said second source/drain region in said MOS floating trap device and to said substrate in which said MOS floating trap device is disposed, said seventh potential being greater than said sixth potential; and applying an eighth potential to said gate in said MOS floating trap device, said eighth potential greater than said sixth potential, said eighth potential being in a ratio to said seventh potential at about 1.5 to about 4.

23. A method as in claim 20 wherein said first duration is about 1 ms to about 5 ms.

24. A method as in claim 20 wherein said second duration is about 2 ms to about 20 ms.

25. A method for providing redundancy in a programmable logic device having an MOS floating charge trap device comprising:

applying a first potential to a gate for a first duration;

applying a second potential for said first duration to a substrate in which a MOS charge trapping transistor is disposed, said first potential being about 8 to about 12 volts greater than said second potential;

applying a ground potential for a first duration to a first source/drain of said MOS charge trapping transistor;

applying third potential for a first duration to a second source/drain region of said MOS charge trapping transistor, said third potential being about 4 to about 7 volts greater than said second potential;

sensing for a predetermined amount of stored charge in a first area above said first source/drain region junction in said MOS floating trap device;

applying a fourth potential for a second duration after said first duration to said gate of said MOS floating trap device; and applying a fifth potential for said second duration to said substrate in which said MOS charge trapping transistor is formed, said fourth potential being about 12 to about 16 volts greater than said fifth potential.

26. A method as in claim 25 wherein said sensing for a predetermined amount of stored charge in said first area in said MOS floating trap device further comprises:

applying a sixth potential to said first source/drain region in said MOS floating trap device;

applying a seventh potential to said second source/drain region in said MOS floating trap device and to said substrate in which said MOS floating trap device is disposed, said sixth potential being about 1 to about 2 volts greater than said seventh potential; and applying an eighth potential to said gate in said MOS floating trap device, said eighth potential is about 3 to about 4 volts greater than said seventh potential.

27. A method as in claim 25 wherein said sensing for a predetermined amount of stored charge in said first area of said MOS floating trap device further comprises:

applying a sixth potential to said first source/drain region in said MOS floating trap device;

applying seventh potential to said second source/drain region in said MOS floating trap device and to said substrate in which said MOS floating trap device is disposed, said seventh potential being about 1 to about 2 volts greater than said sixth potential; and applying an eighth potential to said gate in said MOS floating trap device, said eighth potential is about 3 to about 4 volts greater than said sixth potential.

28. A method as in claim 25 wherein said first duration is about 1 ms to about 5 ms.

29. A method as in claim 25 wherein said second duration is about 2 ms to about 20 ms.

30. A method for providing redundancy in a programmable logic device having an MOS floating charge trap device erased by hot hole injection comprising:
sensing for a predetermined amount of stored charge in a first area above a first source/drain region junction in the MOS floating trap device; and
erasing said charge by Fowler-Nordheim tunneling in the MOS floating trap device, said stored charge in said first area is greater than said predetermined amount.

31. A method as in claim 30 wherein said Fowler-Nordheim tunneling is applied for a duration of about 2 ms to about 20 ms.

32. A method as in claim 30 wherein said sensing for a predetermined amount of stored charge in said first area in said MOS floating trap device further comprises:
applying a first potential to a first source/drain region associated with said first source/drain region junction in said MOS floating trap device;
applying a second potential to a second source/drain region associated with said second source/drain region junction in said MOS floating trap device and to a substrate in which said MOS floating trap device is disposed, said first potential being about 1 to about 2 volts greater than said second potential; and
applying to a gate in said MOS floating trap device a third potential of about 3 to about 4 volts greater than said second potential.

33. A method as in claim 30 wherein said sensing for a predetermined amount of stored charge in said first area of said MOS floating trap device comprising:
applying a first potential to a first source/drain region associated with said first source/drain region junction in said MOS floating trap device and to a substrate in which said MOS floating trap device is disposed;
applying a second potential to a second source/drain region associated with said second source/drain region junction in said MOS floating trap device, said second potential being about 1 to about 2 volts greater than said first potential; and
applying a third potential to a gate in said MOS floating trap device, said third potential being about 3 to about 4 volts greater than said first potential.

34. A method as in claim 30 wherein said erasing said charge by Fowler-Nordheim tunneling further comprises:
applying a first potential to the gate of the MOS charge trapping transistor; and
applying a second potential to the substrate in which the MOS charge trapping transistor is formed, said first potential being about 12 to about 16 volts less than said second potential.

35. A method as in claim 34 wherein said first potential and said second potential are applied for a duration of about 2 ms to about 20 ms.

36. A method for providing redundancy in a programmable logic device having an MOS floating charge trap device programmed by hot hole injection comprising:
sensing for a predetermined amount of stored charge in a first area above a first source/drain region junction in the MOS floating trap device;

applying a first potential to a gate of the MOS charge trapping transistor; and
applying a second potential to a substrate in which the MOS charge trapping transistor is formed, said first potential being about 12 to about 16 volts less than said second potential.

37. A method as in claim 36 wherein said first potential and said second potentials are applied for a duration of about 2 ms to about 20 ms.

38. A method as in claim 36 wherein said sensing for a predetermined amount of stored charge in said first area in said MOS floating trap device further comprises:
applying a third potential to a first source/drain region associated with said first source/drain region junction in said MOS floating trap device;
applying a fourth potential to a second source/drain region associated with said second source/drain region junction in said floating trap device and to a substrate in which said MOS floating trap device is disposed, said third potential being about 1 to about 2 volts greater than said fourth potential; and
applying a fifth potential to a gate in said MOS floating trap device, said fifth potential of about 3 to about 4 volts greater than said fourth potential.

39. A method as in claim 36 wherein said sensing for a predetermined amount of stored charge in said first area of said MOS floating trap device further comprises:
applying a third potential to a first source/drain region associated with said first source/drain region junction in said MOS floating trap device and to a substrate in which said MOS floating trap device is disposed;
applying a fourth potential to a second source/drain region associated with said second source/drain region junction in said MOS floating trap device, said fourth potential being about 1 to about 2 volts greater than said third potential; and
applying a fifth potential to a gate in said MOS floating trap device, said fifth potential being about 3 to about 4 volts greater than said third potential.

40. A method for providing redundancy in a programmable logic device having an MOS floating charge trap device comprising:
applying a first potential to a gate for a first duration;
applying a second potential for said first duration to a substrate in which said MOS charge trapping transistor is disposed, said first potential being about 8 to about 12 volts less than said second potential;
applying a third potential for a first duration to a first source/drain region of said MOS charge trapping transistor, said third potential being about 4 to about 7 volts greater than said second potential;
sensing for a predetermined amount of stored charge in a first area above a first source/drain region junction associated with said first source/drain region in said MOS floating trap device;
applying a fourth potential for a second duration after said first duration to said gate of said MOS floating trap device; and
applying a fifth potential for said second duration to said substrate in which said MOS charge trapping transistor is formed, said fourth potential being about 12 to about 16 volts less than said fifth potential.

41. A method as in claim 40 wherein said sensing for a predetermined amount of stored charge in said first area in said MOS floating trap device further comprises:
applying a sixth potential to said first source/drain region in said MOS floating trap device;

applying a seventh potential to a second source/drain region in said MOS floating trap device and to said substrate in which said MOS floating trap device is disposed, said sixth potential being about 1 to about 2 volts greater than said seventh potential; and applying to said gate in said MOS floating trap device an eighth potential of about 3 to about 4 volts greater than said seventh potential.

42. A method as in claim 40 wherein sensing for a predetermined amount of stored charge in said first area of said MOS floating trap device further comprises:

applying a sixth potential to said first source/drain region in said MOS floating trap device;

applying a seventh potential to a second source/drain region in said MOS floating trap device and to said substrate in which said MOS floating trap device is disposed, said seventh potential being about 1 to about 2 volts greater than said sixth potential; and applying an eighth potential to said gate in said MOS floating trap device, said eighth potential of about 3 to about 4 volts greater than said sixth potential.

43. A method as in claim 40 wherein said first duration is about 1 ms to about 5 ms.

44. A method as in claim 40 wherein said second duration is about 2 ms to about 20 ms.

45. A method as in claim 40 further including:

applying said third potential for said first duration to a second source/drain region of said MOS charge trapping transistor.

46. A method as in claim 45 wherein said sensing for a predetermined amount of stored charge in said first area in said MOS floating trap device further comprises:

applying a sixth potential to said first source/drain region in said MOS floating trap device;

applying a seventh potential to said second source/drain region in said MOS floating trap device and to said substrate in which said MOS floating trap device is disposed, said sixth potential being about 1 to about 2 volts greater than said seventh potential; and applying an eighth potential to said gate in said MOS floating trap device, said eighth potential being about 3 to about 4 volts greater than said seventh potential.

47. A method as in claim 45 wherein said sensing for a predetermined amount of stored charge in said first area of said MOS floating trap device further comprises:

applying a sixth potential to said first source/drain region in said MOS floating trap device;

applying a seventh potential to said second source/drain region in said MOS floating trap device and to said substrate in which said MOS floating trap device is disposed, said seventh potential being about 1 to about 2 volts greater than said sixth potential; and applying an eighth potential to said gate in said MOS floating trap device, said eighth potential being about 3 to about 4 volts greater than said sixth potential.

48. A method as in claim 45 wherein first duration is about 1 ms to about 5 ms.

49. A method as in claim 45 wherein said second duration is about 2 ms to about 20 ms.

* * * * *